United States Patent

[11] 3,600,652

[72] Inventor Richard E. Riley
Mequon, Wis.
[21] Appl. No. 793,822
[22] Filed Jan. 24, 1969
[45] Patented Aug. 17, 1971
[73] Assignee Allen-Bradley Company
Milwaukee, Wis.

[54] ELECTRICAL CAPACITOR
9 Claims, 1 Drawing Fig.

[52] U.S. Cl. .......... 317/258, 106/39, 252/63.2
[51] Int. Cl. .......... H01g 3/06
[50] Field of Search .......... 317/258; 1/261; 106/39; 252/63.2, 62.9

[56] References Cited
UNITED STATES PATENTS

| | | | |
|---|---|---|---|
| 2,494,699 | 1/1950 | Forrester | 317/258 UX |
| 3,222,283 | 12/1965 | Illyn | 252/62.9 |
| 3,223,905 | 12/1965 | Fabricius | 317/258 |
| 3,267,342 | 8/1966 | Pratt | 317/258 |
| 3,279,947 | 10/1966 | Kaiser | 317/258 X |

*Primary Examiner*—E. A. Goldberg
*Attorneys*—Richard C. Steinmetz, Jr. and Arnold J. Ericsen

ABSTRACT: A dielectric material particularly suited for use in an electrical capacitor. The material has a constituent with particular metals combined with lead niobate. This constituent is dispersed in a ceramic matrix and can be readily deposited as a layer by screen printing techniques. The electrical capacitor may be supported on a substrate and may comprise more than one dielectric layer.

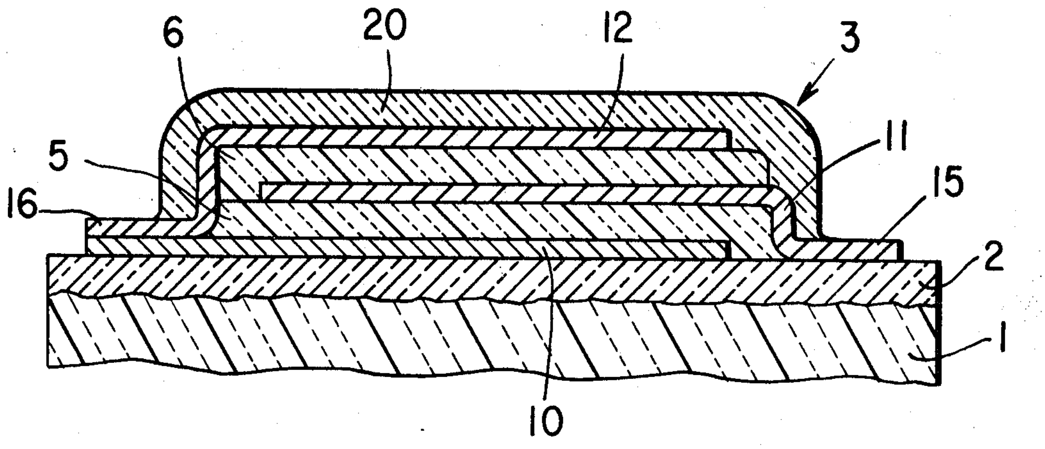
INVENTOR
RICHARD E. RILEY
By:
ATTORNEY
Richard E. Steinmetz Jr.

ELECTRICAL CAPACITOR

BACKGROUND OF THE INVENTION

The electronics field and particularly the electronic component field is constantly seeking to improve not only the product itself but also the methods of manufacturing these electronic products. This search for improvement has been particularly active in the area of capacitor construction; and even more especially for those capacitors which are to be used as a passive element in the rapidly developing microelectronics technology. Whether this capacitor is to be deposited on the substrate containing other electrically functioning portions or whether this capacitor can be better characterized as a discrete electronic component, there is the need that this capacitor be electrically and mechanically reliable, that it be reproducible and that the production method be as controllable and free from complicated or complex steps as is possible.

The development of dielectric materials to provide and meet these desired performance results and manufacturing techniques has met with limited success—especially for capacitors which are to be screen printed. The screen printing technique involves the deposition of the dielectric through a fine mesh screen and onto a masked portion of a substrate. Such screen printing is a most economical method of manufacturing electronic components.

Of particular interest today among performance parameters is a dielectric material with a higher dielectric constant (K) in order to achieve higher capacitance values per area. At the same time it is desired that dielectric materials have improved temperature coefficients (TCC) over wider temperature ranges. Other parameters for measuring satisfactory capacitor performance include the dissipation factor, the aging rate, which is a measure of capacitance change per unit of time, the voltage breakdown characteristics and the insulation resistance.

A typically available high K material has a capacitance of 4000 pF/cm.$^2$ and a TCC represented by a range of $-20$ percent to $+22$ percent measured over a temperature range between $-55°$ C. and $+125°$ C. respectively.

It will be readily understood that the wide variety of uses for capacitors require an equally wide variety of capacitor performance parameters. Therefore, a significant advantage is found in a dielectric material which can produce these wide variety of parameters with a minimum of variations in material composition; and hence, a minimum of change in the manufacturing processes associated with capacitor manufacture.

This invention satisfies these advantages by providing a superior dielectric material which can be easily and simply modified to provide desired performance parameters for a capacitor. Dielectric constants (K) with a wide range permit capacitance per unit area (pF/cm.$^2$) which include particularly high values. Similarly simple material modifications can provide a variety of temperature coefficients (TCC).

The manufacturing techniques for making capacitors with this dielectric material are similar enough to other known silk screen electronic component manufacturing techniques so as to provide particularly advantageous compatibility therewith. For example, similar material vehicles, firing temperatures and firing cycles can be used in the same equipment as is now used for such components as the screen-printed resistor. Therefore, minimum change is necessary in order to manufacture capacitors separately or in combination with other components.

SUMMARY OF THE INVENTION

This invention concerns a significantly improved dielectric material for use in a capacitor—especially a capacitor produced by screen printing—as well as the capacitor utilizing this material. More particularly, the invention concerns a ceramic constituent based upon lead metaniobate, which constituent is dispersed in a ceramic matrix such as a glass matrix. The desired wide variety of capacitor performance parameters are established principally by elements which are combined with the lead metaniobate to provide a ceramic constituent. For example, a material with a lower dielectric constant (K) may be provided by combining metals such as those taken from the group consisting of Mg, Sr, Ba, Li, Na, K, Rb and Cs. The proportions of these metals with respect to the niobate contribute significantly to not only the K value of the dielectric, but also other parameters. It is recognized that certain niobates have been known and used principally for piezoelectric properties. However, this invention utilizes certain niobates when combined with a ceramic matrix to provide a new material with hitherto unknown and unanticipated properties and flexibility.

The higher dielectric constant (K) properties can be provided by including portions of metals taken from the group consisting of Bi, Zn, Cd, Pb, Sn, Si, Sb, As, Ge and combinations thereof.

The capacitor which can be made with this dielectric material is preferably made by such screen technology with electrodes preferably comprising conducting metal portions dispersed in a ceramic matrix.

DESCRIPTION OF THE DRAWINGS

The drawing shows a cross-sectional view of a capacitor deposited on a substrate.

DESCRIPTION OF PREFERRED EMBODIMENTS

The following description concerns several embodiments of the invention and is set forth for descriptive purposes only. It is to be understood that the scope of the invention is to be found in the appendant claims.

The drawing shows a substrate 1 which may have a top layer such as 2 upon which the capacitor 3 is deposited. The substrate 1 can be made from known substrate materials such as alumina and steatite while the layer 2 can be used to provide a smoother surface using electronic glasses such as are described later. While the invention is not so limited, the drawing shows a capacitor 3 consisting of more than one dielectric layer. That is, the drawing shows a first dielectric layer 5 and a second dielectric layer 6. The electrodes 10 and 11 are to be found on either side of the dielectric layer 5 while the electrodes 11 and 12 border the dielectric layer 6. The capacitor 3 functions in a well-known manner by connecting an electrical circuit to the terminals 15 and 16. A glass seal 20 is used to enclose the electrically functioning portions of the capacitor 3.

Significant to this invention is the dielectric material used for either or both of the dielectric layers 5 and 6. This material comprises a ceramic constituent dispersed in a ceramic matrix. As has been noted above, there are a wide variety of performance parameters to which a capacitor may be designed. The dielectric material of this invention can be easily modified with minimum change in the manufacturing process of the capacitor in order to satisfy this wide variety of performance parameters.

The ceramic constituent is based upon a lead metaniobate (pb$Nb_2O_6$ which can be combined with Metals A and B, based upon the proportions $(y)$B $(X)$A $(w)PbNb_2O_6$. The metals, A, are preferably taken from the group consisting of magnesium, strontium, barium, lithium, sodium, potassium, rubidium, cesium, and combinations thereof. When $(y)$ is considered minimal, i.e. less than 5 percent, such that the B metal is insignificant the proportions of the above portions designated by $(x)$ for the A metal and $(w)$ for the lead-niobate can be varied within the following ranges in order to provide desired performance—the percentages based upon percent by weight of the ceramic constituent: 1 percent to 99 percent for $(x)$ and 1 percent to 99 percent for $(w)$.

The dielectric material comprises the ceramic constituent and the ceramic matrix although it is to be recognized that other constituents may be present such as the rare earths in varying forms or ceramic materials. Experience has shown that the ceramic matrix should be at least 1 percent and probably not much more than 25 percent by weight of the dielectric material. This proportion is determined in part upon screen printing techniques to be used when depositing the dielectric material. The ceramic constituent can vary as a percentage of the dielectric material in order to provide the desired performance parameters of the deposited dielectric material. It may be desirable that this proportion be as low as 3.75 percent by weight of the dielectric material. However, substantially significant performance of this dielectric material will be realized when the ceramic constituent is at least 50 percent by weight of the dielectric material. It will be understood that these percentages for the constituent do not take into consideration any vehicle used for deposition purposes.

WIth regard to the ceramic matrix, particularly satisfactory results have been achieved by the use of glass as represented by the well-known glass building blocks: RO (e.g. PbO,;ZnO; BaO; $K_2O$ and/or $Na_2O$); $R_2O_3$ (e.g. $B_2O_3$; $Bi_2O_3$ and/or $Al_2O_3$ ) and RO (e.g. $SiO_2$; $TiO_2$ and/or $ZrO_2$). More specific examples of the ceramic matrix take the form of lead, zinc and/or barium borosilicate glasses. It is to be recognized that the particular glass or material used for this matrix is not particularly significant to the invention. For example, it is within the scope of the invention that bismuth oxide may be used as the matrix. By way of further example, glasses such as those sold as Drakenfeld No. 2141 or a glass with the following raw material ingredients, examples A, B and C can be used—shown in percent by weight:

| A | | B | | C | |
|---|---|---|---|---|---|
| PbO | 57.4 | PbO | 2.0 | PbO | 62.2 |
| $B_2O_3$ | 13.0 | ZnO | 22.3 | $B_2O_3$ | 8.5 |
| $SiO_2$ | 26.2 | $B_2O_3$ | 33.9 | $SiO_2$ | 21.4 |
| $Al_2O_3$ | 3.1 | $SiO_2$ | 17.0 | $Al_2O_3$ | 3.0 |
| $ZrO_2$ | 0.3 | $Al_2O_3$ | 8.9 | CdO | 4.9 |
| | | $ZrO_2$ | 3.1 | | |
| | | $Na_2O$ | 7.6 | | |
| | | CaO | 5.0 | | |

The layer 2 is preferably made from an electrical glass which has a sufficiently high softening point to permit the firing of layer deposited thereon, such as electrode 10 and dielectric layer 5, at the necessary temperature. Such firing temperatures are generally considered high, e.g. 1000° C. and above, which requires a high temperature electrical glass for the layer 2. As a general rule, the softening point temperature of the glass for layer 2 should be as high as the firing temperature of the layers such as electrode 10 and dielectric layer 5, since glasses with lower softening point temperature firing and thereby undesirably influence certain performance characteristics of these layers deposited thereon. By way of example, such glasses include the lead borosilicate glasses. For purposes of a specific example of a glass which can be used for the layer 2, the following composition is cited, expressed in percent by weight:

| | |
|---|---|
| 55.0% $SiO_2$ | 7.0% CaO |
| 15.6% $Al_2O_3$ | 14.0% $ZrO_2$ |
| 16.5% $Ba_2O_3$ | 14.0% $Bi_2O_3$ |

This glaze has been used successfully with subsequent firing of layers deposited thereon at temperatures approximately 1100° C.

The dielectric material in which the B metal is nominal or not present, i.e. a proportions which is effectively $(x)$A $(w)PbNb_2O_6$ dispersed in a ceramic matrix, has principal value for materials with lower dielectric constants (K). By adding the B metal so as to provide the proportions $(y)$B $(x)$A $(w)PbNb_2O_6$ dispersed in a ceramic matrix, the dielectric constant (K) can be significantly increased. The material which is used for this ceramic matrix is, again, not critical to the invention such that the discussion above with respect to ceramic matrix materials is also applicable here. The preferred relative proportion for each of the portions is as follows—based upon the percent weight of the respective portion in the ceramic constituent: 5 percent to 75 percent for $(y)$, 5 percent to 75 percent for $(x)$ and 20 percent to 70 percent for $(w)$. Again, the ceramic matrix should be at least 1 percent and probably not much more than 25 percent by weight of the dielectric material. And again, the ceramic constituent may be as low as 5 percent by weight of the dielectric material; but substantially significant performance of the dielectric material will be realized where the ceramic constituent is at least 50 percent by weight of the dielectric material. The metals which make up the B metals are metals preferably taken from the group consisting of bismuth, zinc, cadmium, lead, tin silicon, antimony, arsenic, germanium and combinations thereof.

In making a capacitor utilizing the dielectric materials of this invention, it is preferable to first deposit the electrode 10 upon a substrate 1 which may have a top layer 2. The particular material that makes up this electrode 10 is not critical to the invention. However, an example of an electrode material which has proved successful is a Platinum Gold conductive paste which provides an electrode with the conductor metal portions of platinum and gold dispersed in a ceramic matrix and which is identified in the market as Du Pont 7553 Conductive Paste. This electrode 10 may be deposited by the screen printing technique as may the first dielectric layer 5. Significant is the relative coefficients of expansion for the electrode 10 and the dielectric layer 5, as well as the relative coefficients expansion between the dielectric layer 5 and the substrate 1 or top layer 2. These coefficients of expansion for the several materials should be compatible both at the operating temperatures and at the higher firing temperatures in order to prevent internal stresses and unsatisfactory bonding therebetween.

The process used for this invention utilizes selected raw materials for the dielectric material. Included with these raw materials are the raw materials for the ceramic constituent which include a niobium pentoxide and a lead oxide. The A metals, magnesium, strontium, barium, lithium, sodium, potassium, rubidium or cesium are preferably supplied as carbonates while the B metals, zinc, cadmium, lead, tin, silicon, antimony, arsenic or germanium may be supplied as oxides.

These raw materials as selected for the dielectric material in accordance with the invention are milled and screened. Next, the raw materials are calcined at soak temperatures ranging from 1100° C. to 1320° C. for from 1 to 8 hours. After cooling, the calcined material is again milled and screened.

This prepared material which constitutes the ceramic constituent is then mixed with the ceramic matrix material and vehicles needed for subsequent process steps. As is mentioned above, the ceramic matrix is preferably a glass such as a lead borosilicate glass, e.g. Drakenfeld No. 2141. The vehicles may be an organic solution such as ethyl-cellulose in pine-oil. After milling, the dielectric material is ready for deposition, for example screen printing, onto a substrate to form the dielectric portion of a capacitor.

Before depositing the dielectric material, it is first necessary to deposit an electrode on a support surface such as a substrate 1. This substrate may or may not have a top layer 2 in the form of a first glaze upon which the electrode is deposited; this first glaze providing a smooth surface and compatibility between capacitor and substrate.

The dielectric material is deposited over the electrode and a second electrode is deposited over the dielectric. This process may be continued in order to make multiple layer capacitors. In accordance with well-known technology it is necessary to fire these deposited electrodes and dielectric material layers. However, the firing step may take place after each layer is deposited or after two or more layers have been deposited. It is recognized that the effect of subsequent firing temperatures upon previously fired layers must be considered when selecting materials for these respective layers.

A final sealing glass such as DuPont Sealing glass No. 8185 can be deposited over the deposited and fired layers with subsequent firing. When selecting this sealing glass, consideration must be given to thermal expansion compatibility with the layers to be sealed as well as the strength of the sealing glass as it is found in the capacitor.

Several, more specific examples based upon the above description of the process may be helpful in better understanding the invention.

EXAMPLE I

A low K material with a ceramic constituent having proportions $30Ba70PbNb_2O_6$ in a ceramic matrix was made using the following raw materials and respective weight proportions for the constituent: 78.8 grams PbO; 133.4 grams $Nb_2O_5$ and 29.6 grams $BaCO_3$. These raw materials were milled, screened and calcined and then mixed with No. 2141 Drakenfeld glass and a liquid vehicle in the following relative proportions: 40 grams constituent; 2 grams ceramic matrix material or glass and 18 grams vehicle. The ceramic constituent represented 95 percent by weight of dielectric material when considering the solids only, i.e. excluding the vehicle. This mixture was milled and screened to provide the dielectric material used for deposition.

A glazed alumina substrate was used with this specific example, the glaze made from glasses within the scope of those previously described. A first electrode in the form of the noble metals (gold and palladium) as conductors dispersed in a glass matrix was first deposited on the substrate and fired at 1000° C. for 15 minutes. Then the previously prepared dielectric material was screen printed upon this first electrode and fired at 1000° C. for 15 minutes.

Thereafter, a second electrode was screen printed on the fired dielectric material using a conductive paste identified as Du Pont 7713 Silver Paste which was fired at 621° C. A suitable sealing glass for this unit is Du Pont 8185 sealing glass fired at 604° C.

The properties of the dielectric material as reflected in this example showed a dielectric constant K of 50. The temperature coefficient (TCC) was +4.0 percent at −55° C. and −3.5 percent at +125° C. The capacitance was measured to be 3120PF/cm.$^2$0.16 percent.

Finally, the aging rate, which represents a loss or change of capacitance per a unit of time, was 0.20 percent per decade hour.

The adaptability of this dielectric can be illustrated by using the above specific example and changing the relative proportions of the portions which make up the ceramic constituent. The respective properties for such dielectric materials are shown as follows:

| Composition | Dielectric constant (K) | Dissipation factor (percent) | T.C.C. percent change at −55, 125° C. |
|---|---|---|---|
| $1Ba99PbNb_2O_6$ | 187 | 1.20 | +2.0, −5.0 |
| $30Ba70PbNb_2O_6$ | 50 | 0.16 | +6.0, −3.5 |
| $55Ba45PbNb_2O_6$ | 218 | 1.78 | +4.5, −2.8 |
| $70Ba30PbNb_2O_6$ | 222 | 2.66 | −10.0, +6.0 |
| $99Ba1PbNb_2O_6$ | 28 | 1.09 | −10.0, +50.0 |

EXAMPLE II

Another example used the proportions 10Bi 30 Sr $70PbNb_2O_5$ for the ceramic constituent of the dielectric material. The process followed and the materials used were otherwise similar to those set forth in the example and process discussed above. The dielectric constant of the material was 97 while the TCC was +0.37 percent at −55° C. and −3.78 percent at 125° C. Capacitance was measured at 6000 pF/cm.$^2$ convert units and the dissipation factor was 0.55 percent.

The following several examples will help to better understand the invention as reflected in the dialectric material wherein higher dielectric constant (K) properties are achieved.

EXAMPLE III

The first example is a material with a ceramic constituent having proportions 10Bi 50Ba 40 $PbNb_2O_6$ in a ceramic matrix. The constituent was made from the following raw materials and respective weight proportions: 44.6 grams PbO; 49.2 grams $BaCO_3$; 133.4 grams $Nb_2O_5$ and 11.6 grams $Bi_2O_3$. These raw materials were milled, screened and calcined and then mixed with No. 2141 Drakenfeld glass and a liquid vehicle in the following relative proportions: 40 grams constituent; 2 grams ceramic matrix material or glass and 10.5 grams vehicle. Of the solids, i.e. the constituent plus matrix material, the constituent comprised 95 percent by weight. This mixture was milled to provide the dielectric material used for deposition.

An unglazed alumina substrate was used with this specific example. A first electrode in the form of the noble metals, gold and palladium as conductors dispersed in a glass matrix was first deposited on the substrate and fired at 1000° C. for 15 minutes. Then the previously prepared dielectric material was screen printed upon this first electrode and fired at 1000° C. for 15 minutes.

Thereafter, a second electrode was screen printed on the fired dielectric material using the conductive paste used for the first electrode which was fired at 1100° C. for 15 minutes. A suitable sealing glass is Du Pont 8185 sealing glass, fired at 604° C. for 10 minutes. The properties of the dielectric material as reflected in this example showed a dielectric constant K of 3200. The TCC was −10 percent at −55° C. and +20 percent at +125° C. The capacitance was measured to be 126,000pF/cm.$^2$, while the dissipation factor was 1.82 percent.

The adaptability of this dielectric material can again be illustrated by using the above specific example and changing the relative proportions of the portions which make up the ceramic constituent. The respective properties for such dielectric materials are shown as follows:

| Composition | Dielectric constant (K) | Dissipation factor (percent) | T.C.C. percent change at −55° C., +125° C. |
|---|---|---|---|
| $5Bi75Ba20PbNb_2O_6$ | 705 | 3.59 | −18, +15 |
| $20Bi20Ba60PbNb_2O_6$ | 2,450 | 3.00 | −30, +30 |
| $30Bi50Ba20PbNb_2O_6$ | 1,030 | 1.01 | −16, −16 |
| $50Bi10Ba40PbNb_2O_6$ | 684 | 4.60 | +8, −8 |
| $75Bi5Ba20PbNb_2O_6$ | 327 | 2.64 | −14, −3 |

EXAMPLE IV

Another example used the proportions 20Zn 40Ba $40PbNb_2O_6$ for the ceramic constituent of the dielectric material. The raw materials and respective weight proportions used for the constituent were as follows: 89.2 grams PbO; 78.8 grams $BaCO_3$; 266.6 grams $Nb_2O_6$ and 16.1 grams Zno. The process followed and materials used were otherwise similar to those set forth in the example and process discussed above. The dielectric constant of the material was 718 while the capacitance was measured to be 28,300pF/cm.$^2$ and the dissipation factor was 1.73 percent.

EXAMPLE V

Another example used the proportions 20Cd 20Sr 20Ba $40PbNb_2O_6$ for the ceramic constituent of the dielectric material. The raw materials and respective weight proportions used for the constituent were as follows: 89.2 grams PbO; 20.8 grams SrO; 25.7 grams CdO; 39.4 grams $BaCO_3$ and 267.7 $Nb_2O_5$.

The process followed and the materials used were otherwise similar to those set forth in the example and process discussed except that two dielectric layers similar to the layers 5 and 6 in the drawing, with corresponding electrodes were deposited. Both the dielectric and the electrode were fired at 1150° C. The dielectric of the material was 3620, and the TCC measured −32.3 percent at −55° C. and +29.1 percent at 125° C. The capacitance was determined to be 285,000pF/cm.$^2$ while the dissipation factor was 1.26 percent.

I claim:

1. An electrical capacitor comprising:
  a. first and second electrodes
  b. a dielectric material between said electrodes, said material comprising:
    1. A ceramic constituent having the proportions $(y)$B $(x)$A $(w)$Pb$Nb_2 0_6$ wherein,
      a. A comprises a metal taken from the group consisting of Mg, Sr, Ba, Li, Na, K, Rb, Cs and combinations thereof;
      b. B comprises a metal taken from the group consisting of Bi, Zn, Cd, Pb, Sn, Si, Sb, As, Ge and combinations thereof;
      c. $(y)$ is 5 to 75 percent by weight of said constituent;
      d. $(x)$ is 5 to 75 percent by weight of said constituent;
      e. $(w)$ is 20 to 70 percent by weight of said constituent; and
    2. A ceramic matrix in which said constituent is dispersed.

2. The electrical capacitor of claim 1 wherein said ceramic matrix is at least 1 percent and no more than 25 percent by weight of the dielectric material.

3. The electrical capacitor of claim 1 wherein said ceramic constituent is at least 50 percent by weight of the dielectric material.

4. The electrical capacitor of claim 1 wherein said first electrode comprises,
  a. a ceramic matrix; and
  b. metal conductors dispersed in said matrix of said electrode.

5. The electrical capacitor of claim 1 wherein said first electrode is supported on a substrate.

6. The electrical capacitor of claim 1 wherein there are a plurality of layers of said dielectric material with first and second electrodes for each said layer.

7. An electrical capacitor comprising:
  a. first and second electrodes
  b. a dielectric material between said electrodes, said material comprising:
    1. A ceramic constituent having the proportions $(y)$B $(x)$A $(w)$Pb$Nb_2 0_6$ wherein,
      a. $(y)$ is 10 to 50 percent by weight of said constituent;
      b. $(x)$ is 10 to 50 percent by weight of said constituent;
      c. $(z)$ is 20 to 70 percent by weight of said constituent;
      d. A comprises the metal Ba; and
      e. B comprises the metal Bi; and
    2. A ceramic matrix in which said constituent is dispersed.

8. The electrical capacitor of claim 7 wherein said first electrode comprises,
  a. a ceramic matrix; and
  b. metal conductors dispersed in said matrix of said electrode.

9. The electrical capacitor of claim 7 wherein said substrate has a top layer of glass between said first electrode and said substrate.